July 29, 1969 E. SIMON 3,458,781

HIGH-VOLTAGE PLANAR SEMICONDUCTOR DEVICES

Filed July 18, 1966

INVENTOR.
EDWARD SIMON

BY

Thomson & Mrose

ATTORNEYS

United States Patent Office 3,458,781

Patented July 29, 1969

3,458,781
HIGH-VOLTAGE PLANAR SEMICONDUCTOR DEVICES

Edward Simon, Manchester, Mass., assignor, by mesne assignments, to Unitrode Corporation, Watertown, Mass., a corporation of Maryland Filed July 18, 1966, Ser. No. 565,996
Int. Cl. H01l 5/00
U.S. Cl. 317—235 15 Claims

ABSTRACT OF THE DISCLOSURE

Planar semiconductor devices in which the junction configuration promotes a relatively large space-charge field and high-voltage breakdown characteristics. A planar junction is formed having a central portion substantially parallel to a surface of the device and a contiguous peripheral portion of rounded configuration and radius of curvature larger than the depth of the central portion.

The present invention relates to improvement of the voltage-breakdown characteristics of semiconductor devices and, in one particular aspect, to novel and improved layer-type electrical semiconductor devices in which the capabilities of withstanding high voltage gradients are significantly enhanced by relatively uncomplicated shaping of junctions through unique deep diffusions which nevertheless permit the formation of desirably shallow junctions.

As is well known, a serious limiting factor in the design and use of planar semiconductor devices is concerned with voltage breakdown levels which are substantially below that which is theoretically possible and desirable. This is understood to depend in part upon critical electrical fields within the semiconductor material and, in turn, upon the kinds and amounts of impurities which may be present. To some extent, and for certain purposes, voltage characteristics may be preestablished by controlling the impurities. However, this approach does not suffice to overcome all of the major difficulties contributing to reduced voltage characteristics, because it is found, for example, that certain junctions will nevertheless exhibit low breakdowns which in theory the resistivities alone should prevent. It has been determined that breakdown susceptibilities at surfaces where the junctions terminate are contributing factors, even though these surfaces are protected and that narrowing of the junction space charge layer at those sites can be held responsible. A combination of electrical and geometrical relationships explains the fact that the junction space charge layer at the surface is narrower than within the associated bulk of semiconductor material, and some improvement has been evidenced when the surface sites of the junctions have been contoured or "bevelled" to promote a geometrically-induced widening of the junction space charge layer there. Breakdown at surface sites is but one of the problems, however, and does not resolve the issues of why breakdowns nevertheless readily occur within the bulk, and how they may be avoided. In accordance with the present teachings, however, very distinct and important improvements in voltage characteristics of semiconductor devices are achieved by treating the internal breakdown difficulties within a bulk of material as having their origins in undesirable inner contouring of junctions which deleteriously alter the electric field configuration at the relatively sharp corners which have hitherto been unavoidable where it is necessary that thin layers of predetermined type of conductivity be produced in such devices as diodes, rectifiers, transistors, thyristors and related devices. As is taught herein, these thin layers are advantageously formed in integrated relationship with surrounding zones which are more deeply penetrating into the bulk and which produce junction shapings everywhere causing the associated electric field to have a large enough depth to suppress low-voltage breakdowns.

It is one of the objects of the present invention, therefore, to provide novel and improved semiconductor devices including junctions having configurations internally of a bulk of material which promote high voltage characteristics while preserving advantages of thin layers of material of predetermined conductivity type.

Another object is to provide unique and highly beneficial processing of semiconductor materials which increases breakdown voltages at internal junction sites contiguous with thin regions of the material having predetermined conductivity characteristics.

A further object is to provide high-voltage planar semiconductor devices in which a relatively thin region of one conductivity type is bordered by a relatively deep region of the same conductivity type having a relatively large radius of curvature which maintains a favorable space charge distribution in an adjoining region.

A still further object is to provide a process for the manufacture of high-voltage planar semiconductor devices wherein impurity material is caused to make a relatively deep penetration into a region of different conductivity type and to occupy an adjoining surrounding relation to a relatively shallow penetration thereof.

By way of a summary account of practice of this invention in one of its aspects, impurity material capable of imparting P-type conductivity characteristics is diffused through a surface of an N-type silicon mass through a ring-like masking aperture until the resulting PN junction has penetrated relatively deeply into the mass, with cross sections of the P-type material exhibiting a resulting relatively large radius of curvature. Subsequently, a further relatively shallow diffusion of the same impurity material, with the entire ring left unmasked, creates a desirably thin layer of P-type material within the integral surrounding ring of more deeply penetrated ring of P-type material, the thin layer then accommodating a yet thinner layer of N-type material within its confines. The resulting structure, with contacts added, produces a space-charge field outside the P-type region which, although it may have irregularities in configuration, is everywhere widely spaced from the PN junction and displays outstanding resistance to voltage-induced failures.

Although the aspects and features of this invention which are believed to be novel are expressed in the appended claims, additional details as to preferred practices and embodiments, and as to the further advantages, objects and features thereof, may be most readily comprehended through reference to the following description taken in connection with the accompanying drawings, wherein:

Figure 5:
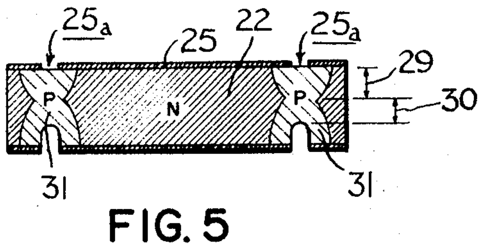
FIGURE 5 shows the material of FIGURE 4 after a deep diffusion of an impurity through etched-away regions of the surfaces.
Figure 6:
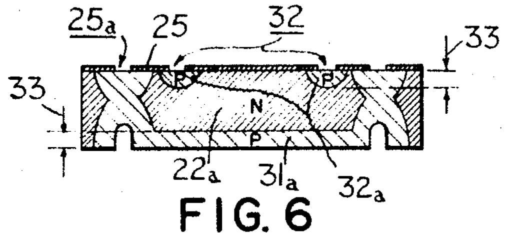
FIGURE 6 illustrates the condition of the material of FIGURE 5 after stripping of oxide from the bottom and from a ring-like area of the top, followed by relatively deep diffusion of an impurity.
Figure 7:
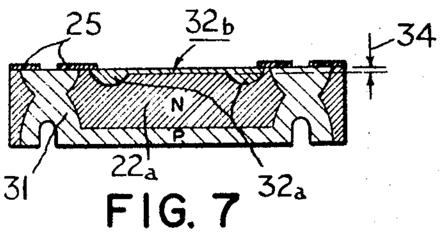
Figure 8:
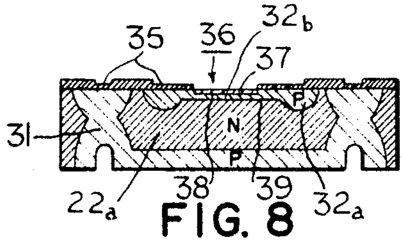
Figure 9:
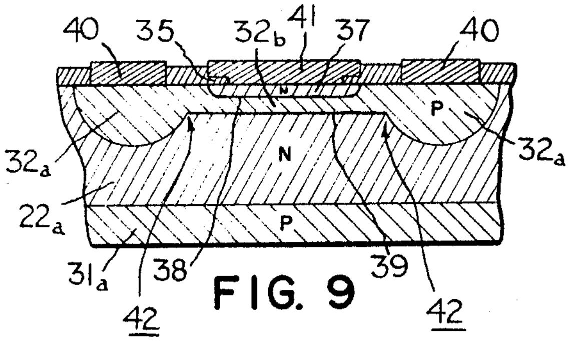
Figure 10:
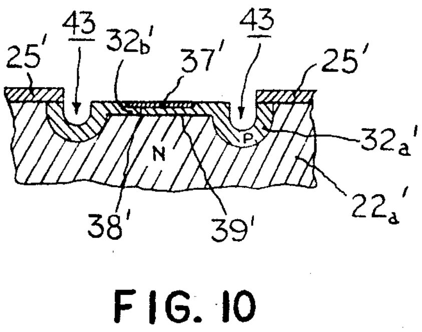

FIGURE 7 characterizes the material of FIGURE 6 after removal of oxide from the ring-enclosed area of the top and after a relatively shallow diffusion of an impurity;

FIGURE 8 shows the material of FIGURE 7 after a further masking, etching, and shallow diffusion of another impurity;

FIGURE 9 represents, in enlargement, a portion of the unit of FIGURE 8 after certain further etching and addition of contacts; and FIGURE 10 illustrates in cross-section a portion of a partly-processed unit such as that of FIGURE 5, after the etching of a ring-like groove and after diffusion of an impurity at the sites of the groove and the included top surface area.

Figure 1:
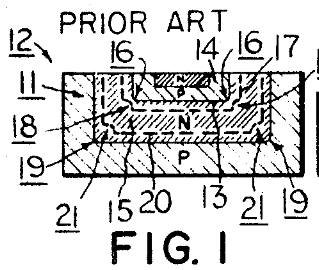
FIGURE 1 represents a cross-section of a multijunction semiconductor unit known in the prior art, together with dashed linework characterizing space-charge field configurations.

In a known general array of semiconductor regions of different conductivity types such as is represented in FIGURE 1, successive diffusions of selected impurities into the different regions of a mass of semiconductor material 11 may serve to develop a sequence of junctions such as those in the illustrated PNPN unit 12. The breakdown voltage characteristics of these junctions often impose serious limitations upon the practical applications of such devices, it being understood that the electric fields associated with the junctions are of controlling importance. Each material establishes its own critical field, and the maximum field bears a relationship to impurity level. Unless the impurities are uniformly distributed, the maximum field will be less at sites of higher impurity concentrations, thereby undesirably reducing the breakdown voltage rating for the associated junction, and for this reason the surface areas where junctions would ordinarily be exposed to ambient impurity contaminations are commonly protected by shielding oxide. As has also been alluded to earlier herein, the electric field configurations near the sites of surface-exposed junctions can also be adversely affected by the geometry of the discontinuity in the material, such that the maximum field there may be much less than within the bulk and may thus limit the voltage tolerances. However, neither the effects of non-uniform impurity distributions nor of the field distortions near surfaces at which the junctions are exposed suffice to explain the low breakdown voltage characteristics found to be associated with a junction such as junction 13 between P-zone 14 and N-zone 15 in FIGURE 1. Instead, it appears that the relatively sharp "corners" 16 of the junction 13, formed as the result of the relatively shallow diffusion which created zone 14, are responsible for this difficulty. Dashed linework 17 characterizes the maximum electric space-charge field width adjacent to that junction in the adjoining N-type zone 15, and, although it is uniform throughout most of the bulk, it tends to draw in close to the aforesaid "corners," as designated by reference characters 18. This tendency may be accounted for by the effects of the geometry which causes the attractive and repulsive forces on electrons near the "corners" to be different from such forces on electrons elsewhere in the bulk. The effects near the outside "corners" 19 are just the reverse, as is illustrated by dashed field linework 20 at the sites 21. Based upon these recognitions, it becomes highly important that the critical electric field in a zone be associated with an adjacent junction having only surface irregularities within the bulk which everywhere have a minimum sharpness of projection toward or into that zone. "Positive" curvatures of a junction, i.e. protrusions in directions away from the zone, are preferred, and, in any event, the "negative" character of curvatures or protrusions of the junction into the zone of interest should be minimized.

Figure 2:
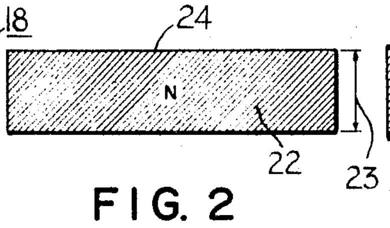
FIGURE 2 is a cross-section of semiconductor material to be used in the manufacture of an improved PNPN device.
Figure 3:
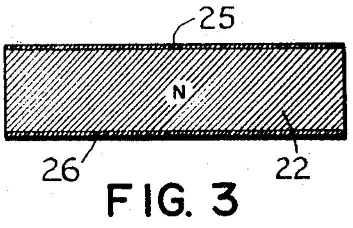
FIGURE 3 depicts the same material oxidized on the top and bottom.
Figure 4:
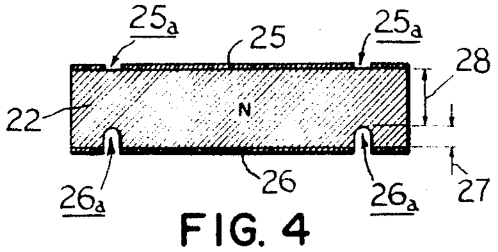
FIGURE 4 illustrates the oxidized material of FIGURE 3 after etching of the top and bottom.

It is found possible to reduce the sharpness of the troublesome "corners" by diffusing impurity material so deeply that these junction corners are automatically well rounded with a relatively large radius of curvature as the impurity travels further into the semiconductor material. However, deep diffusions cannot be accurately controlled, and it thus becomes exceedingly difficult to form a subsequent junction in a predetermined near relation to one which has already been formed by deep diffusion. The sequential practices exemplified in FIGURES 2–9 nevertheless achieve both desired results—high breakdown voltage characteristics, and closely-spaced junctions—in the same device. In an initial state, a mass of N-type silicon 22 (FIGURE 2) having a thickness 23 of about 8 mils (0.008 inch) exhibits a flat polished top surface 24 which will later aid in the diffusion of impurity material to accurately-controlled depths. This mass may of course be part of a mass of much greater expanse than that illustrated. Subsequently, at least the top and bottom surfaces are oxidized to produce protective $SiO_2$ layers, 25 and 26 respectively (FIGURE 3), preferably about 10,000 angstroms thick. After photoresist material has been applied to the top and bottom, and then suitably masked, exposed, and etched, the material has the configuration shown in FIGURE 4, wherein the oxide layers 25 and 26 have been stripped away in identical ring-like paths $25_a$ and $26_a$ which are in substantially true alignment with one another. The bottom path $26_a$ is chemically etched to a ring-like groove having a depth of about 2 mils into the mass, the top surface being waxed or otherwise protected to prevent deeper etching there at the same time, and the remaining depth 28 of mass 22 between the etched rings is thus only about 6 mils. This is followed by deep diffusion of an impurity (such as boron) which produces P-type characteristics, through both etched ring openings $25_a$ and $26_a$, until the diffusions merge after similar penetrations 29 and 30 of only about 3 mils from both the top and bottom. A ring-like region 31 of P-type material is then realized (FIGURE 5). Subsequently, the bottom oxide layer 26 is stripped away, using conventional photographic-etching techniques, and the same kind of stripping is performed at the top to produce a ring-like opening 32 (FIGURE 6) above the N-type material. This is followed by a relatively deep diffusion of an impurity which imparts P-type characteristics to underlying material, to a depth of about 2 mils on the exposed top and bottom as designated by dimensions 33 in FIGURE 6. Ring-like region 31 thus becomes merged with the bottom P-type layer $31_a$, and, importantly, there is an inner ring-like zone $32_a$ of P-type material at the top which has been diffused deeply enough so that its radius of curvature is relatively large and will present no sharp "corners" to the adjoining N-type material $22_a$. The portion of top oxide layer 25 which is encompassed within the ring-like opening 32 is next stripped away, using common photographic-etching techniques, for example, exposing the underlying N-type material, and a relatively shallow diffusion is then performed with impurity material imparting P-type conductivity characteristics. As is shown in FIGURE 7, this results in a desirably shallow P-type layer $32_b$ of precise depth below the flat top surface (example: uniform thickness 34 of about 0.6 mil). This last diffusion may be performed to provide only a relatively low concentration of the impurity, to obtain desired semiconductor device characteristics. Following the production of shallow layer $32_b$, protective oxide 35 is grown back over the top and is then stripped away at a site 36 over the shallow layer so that a very shallow diffusion of impurity material, such as phosphorous, producing N-type conductivity characteristics, will then yield the N-type layer 37 within the relatively shallow P-type layer $32_b$ (FIGURE 8). N-type layer 37 forms a junction 38 closely and precisely spaced in relation to the junction 39 between P-type layer $32_b$ and N-type zone $22_a$, this highly exact relationship being possible because of the accurately-controllable shallow diffusions from the very flat top surface of the silicon mass. Such precision is highly important in transistors and four-layer switching devices, for example. The enlarged fragment depicted in FIGURE 9 includes top-surface metal contacts 40 and 41 with outer ring $32_a$ of the P-type layer and with the central N-type layer 37, respectively, in accordance with known techniques first involving photographic sensitizing and chemical etching at the positions where the oxide layers must be removed to permit the contacts to be deposited where needed. Contacts may also be made with the other conductivity regions in a conventional manner. The lowermost region may obviously be omitted in the manufacture of a transistor structure.

Junction 39 in FIGURE 9 has the desired surface configuration in relation to the underlying N-type zone $22_a$. Marginal junction areas defined by the relatively deeply diffused ring-like formation $32_a$ have an advantageously large radius of curvature, or, as seen by the N-type zone $22_a$, a curvature which is not nearly as negative as would be the expected and hitherto unavoidable "corner" for a simple shallow diffusion of the depth of central zone $32_b$. However, the maximum depth of diffusion into the marginal volumes is too large to permit accurate control of that and a subsequent diffusion, such that there would be little precision in the relative location of the resulting junctions if the central area surrounded by margins $32_a$ were also deeply diffused. The relatively shallow diffusion into this central volume, merged with the marginal volume, of course results in "corners" such as 42, but it will be recognized that these are highly "positive," or protrude away from the zone $22_a$, such that there can be no undesirable constriction of the space-charge field in that zone at such positions. Accordingly, the voltage-breakdown field everywhere within the bulk of the semiconductor material is at a high level because of the internal "surface" configuration of the junction. Moreover, the impurities within the marginal volume $32_a$ and near the top surface tend to be distributed uniformly because of the deep diffusion there, and this important factor likewise insures that a high voltage rating can be realized.

The needed diffusions of impurities to a substantial depth in marginal volumes can be aided by removal of semiconductor material at the marginal sites, as is characterized in FIGURE 10. There, the fragment of a semiconductor mass like that of FIGURES 1–9 has various portions corresponding functionally to those of the earlier figures designated by the same reference characters, with distinguishing single-prime accents added. Once the flat and polished top surface of the N-type material has been oxidized to form a protective layer 25', a central area is stripped of that layer only in a ring-like area, and that area is then chemically etched to form a corresponding relatively deep ring-like groove 43. Impurity material imparting P-type conductivity characteristics is then diffused into the central area, to a uniform shallow depth such as that required at central region $32_{b'}$. Although the diffusion is only to a relatively shallow depth, the presence of the relatively deep marginal groove 43 causes the diffusion through it to produce a surface configuration at the margins of the resulting junction 39' to be substantially the same as those for the junction 39 which resulted from longer deep diffusion. The junction surface pattern similarly promotes high voltage ratings. Where the uniform-impurity-distribution advantages of deep diffusion are to be realized also, the diffusions may of course be in two steps, with the grooving shortening the diffusion time somewhat, and with the central area being masked until the relatively shallow diffusion is to be performed there. The shaping due to material removal need not be limited to that of a narrow groove, so long as the resulting junction "surface" configuration does not contain sharp protrusions into the zone where the space-charge field depth is of critical importance. The materials for and techniques of masking photoresist materials and exposing them and etching away masked areas are of course well known in the art, as are also the materials and techniques for adding impurities, developing oxide layers, adding contacts, and removing material by etching and the like, and are thus not discussed at length herein. It should be appreciated that the ring-like relatively deep regions may, from above, be shaped to be of circular, rectangular or other geometrical outline, as dictated by other design considerations, and that a number of such regions may be located on the same semiconductor mass or may be in a nested relationship. Silicon has been referred to in the illustrated examples, but other semiconductor materials may be used and devices other than simple transistors and switches may incorporate these improvements. Accordingly, it is to be understood that the embodiments and practices described and portrayed have been presented by way of disclosure, rather than limitation, and that various modifications, substitutions and combinations may be effected without departure from the spirit and scope of this invention in its broader aspects.

What I claim as new and desire to secure by Letters Patent of the United States is:

1. An electrical semiconductor unit comprising a first region of semiconductor material of one conductivity type, and a second region of different conductivity type adjoining said first region and forming a junction therewith, said junction having a central portion of relatively shallow uniform depth in relation to one surface of said unit and a contiguous peripheral portion which extends inwardly of said surface by an amount which is large in relation to said shallow depth, said peripheral portion having a rounded configuration of large radius of curvature, thereby to promote a relatively large space-charge field and high voltage breakdown characteristics.

2. An electrical semiconductor unit as set forth in claim 1 wherein said peripheral portion is in surrounding-outer peripheral relation to said shallow portion and wherein said junction at the site of said peripheral portion is of blunt configuration which avoids sharp projections into the underlying region.

3. An electrical semiconductor unit as set forth in claim 2 wherein said peripheral portion has a closed ring-like configuration and has transverse cross-sections having at substantially all positions a radius of curvature which is large in relation to said shallow depth.

4. An electrical semiconductor unit as set forth in claim 3 further including a groove in said surface having a substantially closed ring-like configuration aligned with said bordering portion.

5. An electrical semiconductor unit as set forth in claim 4 wherein said groove is of a depth substantially equal to the depth of said bordering portion less the depth of said shallow portion.

6. An electrical semiconductor unit as set forth in claim 1 wherein said second region is of N-type material and said first region is of P-type material, said P-type material of said first region having a relatively shallow depth and extending inwardly of said surface by a relatively large amount to form said junction.

7. An electrical semiconductor unit as set forth in claim 6 further including a third region of N-type material forming another junction with the P-type material of said first region lying between said shallow portion of said junction and said surface.

8. An electrical semiconductor unit as set forth in claim 7 wherein said regions comprise silicon semiconductor material.

9. An electrical semiconductor unit as set forth in claim 8 further comprising a fourth region of P-type material forming a junction with said second region, said regions constituting the regions of a PNPN switching unit.

10. An electrical semiconductor unit as set forth in claim 1 further including a third region of depth shallower than said shallow depth forming another junction lying between said shallow portion of said junction and said surface, said third region being of conductivity type different from that of the one of said first and second regions which it adjoins to form said other junction.

11. An electrical semiconductor unit as set forth in claim 10 wherein said surface is substantially flat, wherein said one of said regions includes conductivity-inducing impurity material diffused therein through said substantially flat surface, and wherein said third region includes conductivity-inducing material diffused therein through said substantially flat surface.

12. An electrical semiconductor unit as set forth in claim 11 wherein both of said junctions extend to said surface, said other of said junctions being nested within the one of said junction between said first and second regions and being in closely-spaced substantially parallel relation to said one of said junctions at the site of said shallow portion thereof.

13. An electrical semiconductor unit as set forth in claim 1 wherein said surface is substantially flat and said junction is disposed between the material of one of said regions and the material of the other of said regions having conductivity-inducing impurity material diffused therein through said substantially flat surface.

14. An electrical semiconductor unit comprising a mass of silicon semiconductor material having a substantially flat surface, a first region of said mass having N-type conductivity, a second region of said mass having impurity material which produces P-type conductivity diffused therein through said surface, said second region having a uniformly-thin central portion which is relatively shallow and adjacent to said surface, said second region further having a relatively thick and wide marginal portion of ring-like configuration surrounding and merged with said central portion and exposed along said surface, and a third region of said mass having impurity material which produces N-type conductivity diffused therein through said surface, said third region being exposed along said surface and being uniformly thin and surrounded by said marginal portion of said second region, said portion of ring-like configuration having a rounded configuration of large radius of curvature, thereby to promote a relatively large space-charge field and high voltage breakdown characteristics.

15. An electrical semiconductor unit comprising a first region of semiconductor material of one conductivity type, and a second region of different conductivity type adjoining said first region and forming a junction therewith, said junction having a central portion substantially parallel to a surface of said unit and a contiguous peripheral portion extending to said surface and having a rounded configuration of radius of curvature larger than the depth of said central portion, thereby to promote a relatively large space-charge field and high voltage breakdown characteristics.

References Cited

UNITED STATES PATENTS

| | | | |
|---|---|---|---|
| 2,959,504 | 11/1960 | Ross et al. | 148—33 |
| 3,078,196 | 2/1963 | Ross | 148—33 |
| 3,220,896 | 11/1965 | Miller | 148—33.5 |
| 3,223,904 | 12/1965 | Warner et al. | 317—235 |
| 3,246,172 | 4/1966 | Sanford | 307—88.5 |
| 3,277,352 | 10/1966 | Hubner | 317—234 |
| 3,312,881 | 4/1967 | Yu | 317—235 |
| 3,358,195 | 12/1967 | Onodera | 317—234 |

JAMES W. LAWRENCE, Primary Examiner
R. SANDLER, Assistant Examiner

U.S. Cl. X.R.

148—187